(12) United States Patent
Chen

(10) Patent No.: US 11,337,337 B2
(45) Date of Patent: May 17, 2022

(54) DISSIPATING DEVICE

(71) Applicant: Therlect Co., Ltd, Taoyuan (TW)

(72) Inventor: Chien Yu Chen, Taoyuan (TW)

(73) Assignee: THERLECT CO., LTD, Taoyuan (TW)

( * ) Notice: Subject to any disclaimer, the term of this patent is extended or adjusted under 35 U.S.C. 154(b) by 0 days.

(21) Appl. No.: 17/017,033

(22) Filed: Sep. 10, 2020

(65) Prior Publication Data
US 2021/0289664 A1 Sep. 16, 2021

(30) Foreign Application Priority Data

Mar. 11, 2020 (TW) .................................. 109108013

(51) Int. Cl.
*H05K 7/20* (2006.01)
(52) U.S. Cl.
CPC ................... *H05K 7/20336* (2013.01)
(58) Field of Classification Search
CPC ............. H05K 7/20309; H05K 7/20336
See application file for complete search history.

(56) References Cited

U.S. PATENT DOCUMENTS

| 7,455,101 | B2 * | 11/2008 | Hsu ...................... F04B 19/24 165/104.29 |
| 2011/0056655 | A1 * | 3/2011 | Kline .................... F28F 23/00 165/104.14 |
| 2020/0404802 | A1 * | 12/2020 | Takahashi ............ F28D 15/046 |

\* cited by examiner

*Primary Examiner* — Mukundbhai G Patel
(74) *Attorney, Agent, or Firm* — Muncy, Geissler, Olds & Lowe, P.C.

(57) ABSTRACT

A dissipating device applied to an electronic device and configured to absorb the heat source generated by the electronic device. A thermal conductive fluid is filled in the dissipating device of the present disclosure. The thermal conductive fluid is a mixture of two immiscible fluid mediums. When the thermal conductive fluid contacts the heat source of the electronic device, the thermal conductive fluid will continuously undergo a phase transition cycle to speed up the heat dissipation effect of the dissipating device on the electronic device and achieve an excellent heat dissipation effect.

10 Claims, 16 Drawing Sheets

DISSIPATING DEVICE

BACKGROUND OF INVENTION

(1) Field of the Present Disclosure

The present disclosure relates to a dissipating device, especially a dissipating device that employs two immiscible liquids to undergo the phase transition for dissipating heat from an electronic device.

(2) Brief Description of Related Art

Electronic devices such as mobile phones play an indispensable role in people's lives. In order to facilitate portability and use, the electronic devices tend to be lighter, thinner and more versatile. Due to the high density and frequency of electronic components, it's easy to cause local overheating after use for a longer time. The chip of an electronic device is usually the main heat source during operation. A heat dissipating unit is not only configured to reduce the temperature of the chip itself to ensure that it can work normally within a required temperature range, but also to take into account that the heat can not cause local overheating of the external case, resulting in a bad use experience. At present, the heat dissipating methods of the electronic devices mainly include such as arrangement of openings, thermal conduction, thermal convection or heat pipes. However, these heat dissipating methods can no longer resolve the problem with the heat energy generated by today's high-performance chips. It is not possible to dissipate heat by installing heat pipes in thin and light electronic devices, thereby causing overheating problems. The heat energy cannot be evenly distributed, which leads to a reduction in the heat dissipating efficiency inside the electronic device, which in turn causes the mobile phone to operate too slowly or crash. Therefore, how to effectively dissipate heat on the electronic devices that tend to be thinner and thinner is a problem to be solved.

SUMMARY OF INVENTION

It is a primary object of the present disclosure to provide a dissipating device that employs two immiscible fluid mediums as a thermal conductive fluid to dissipate heat from an electronic device through the phase transition of the thermal conductive fluid.

To achieve the aforementioned purpose, the present disclosure of the dissipating device is mainly composed of a first sheet body and a second slice body. An accommodating space is created after the first sheet body and the second sheet body are joined together. The accommodating space is filled with a thermal conductive fluid which is a mixture of two immiscible fluid mediums. When the dissipating device is close to the heat source of the electronic device, the thermal conductive fluid will gradually undergo the phase transition, thereby achieving a continuous circulation and flow of the thermal conductive fluid. Accordingly, the electronic device can be cooled down by means of the phase transition of the thermal conductive fluid.

DETAILED DESCRIPTION OF PREFERRED EMBODIMENTS

Figure 1:
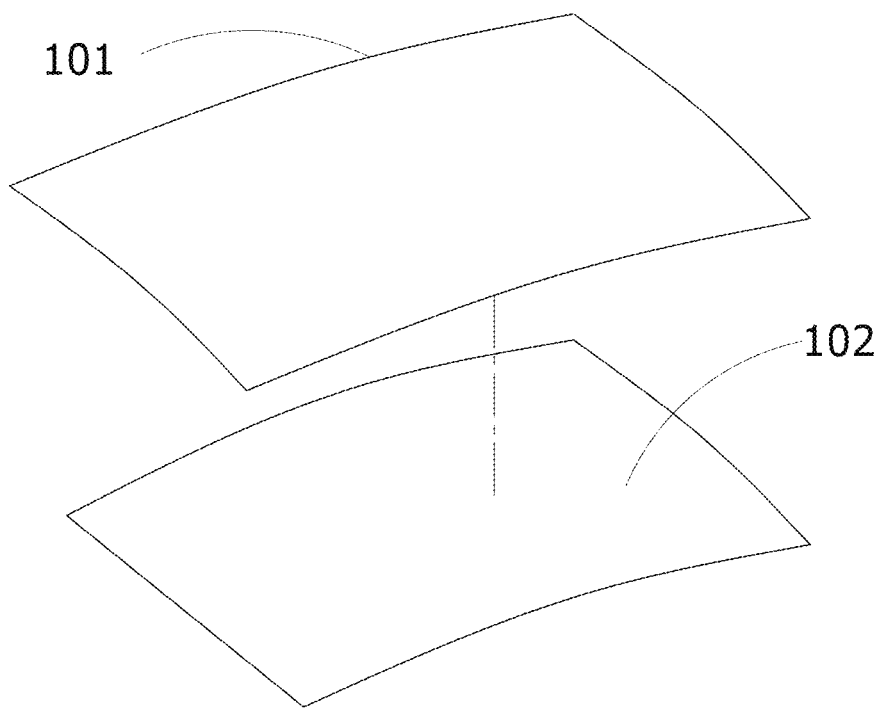
FIG. 1 is an exploded view of a first embodiment of the present disclosure.
Figure 2:
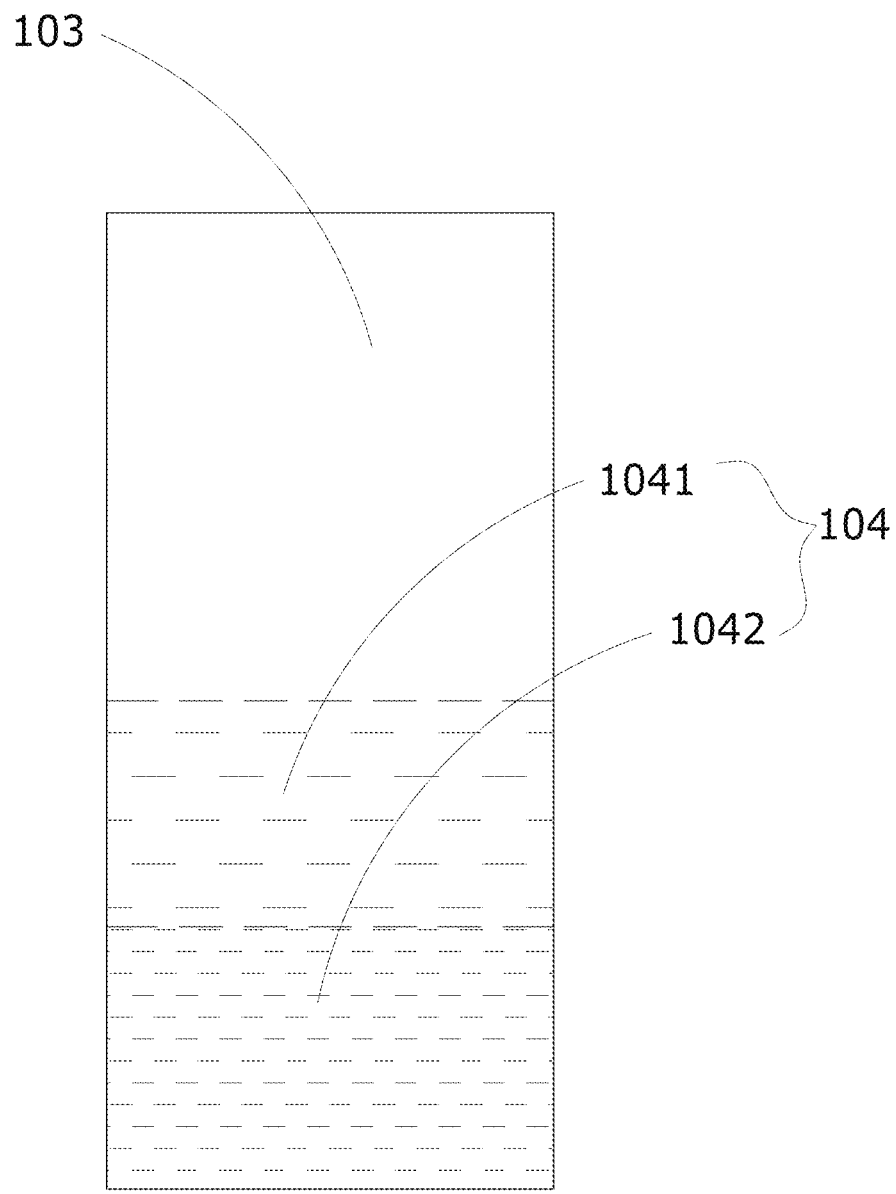
FIG. 2 is a schematic view of the first embodiment of the present disclosure.

Referring to FIG. 1, a dissipating device 10 according to the present disclosure includes a first sheet body 101 and a second sheet body 102. The first sheet body 101 and the second sheet body 102 are made of thin metal materials, such as copper, aluminum and other materials with good ductility. The peripheral edges of the first sheet body 101 and the second sheet body 102 are joined by, for example, ultrasonic welding or adhesion such that the edges of the two sheet bodies 101, 102 can be closely joined together. As shown in FIG. 2, an accommodating space 103 is formed between the two sheet bodies 101, 102 and filled with a thermal conductive fluid 104. The volume ratio of the thermal conductive fluid 104 to the accommodating space 103 ranges from 0.5 to 0.95, while the preferred volume ratio is 0.5. The thermal conductive fluid 104 is composed of a first fluid medium 1041 and a second fluid medium 1042 which are different in specific gravity and density and are immiscible with each other. The first fluid medium 1041 may be formed, for example, by mixing an alcohols and water, while the second fluid medium 1042 may be, for example, fluoride. The first fluid medium 1041 and the second fluid medium 1042 are mixed as shown in FIG. 2. The second fluid medium 1042 with a higher specific gravity will sink below the first fluid medium 1041 under normal conditions, so that the thermal conductive fluid 104 will form a state in which two layers of liquid overlap.

Figure 3:
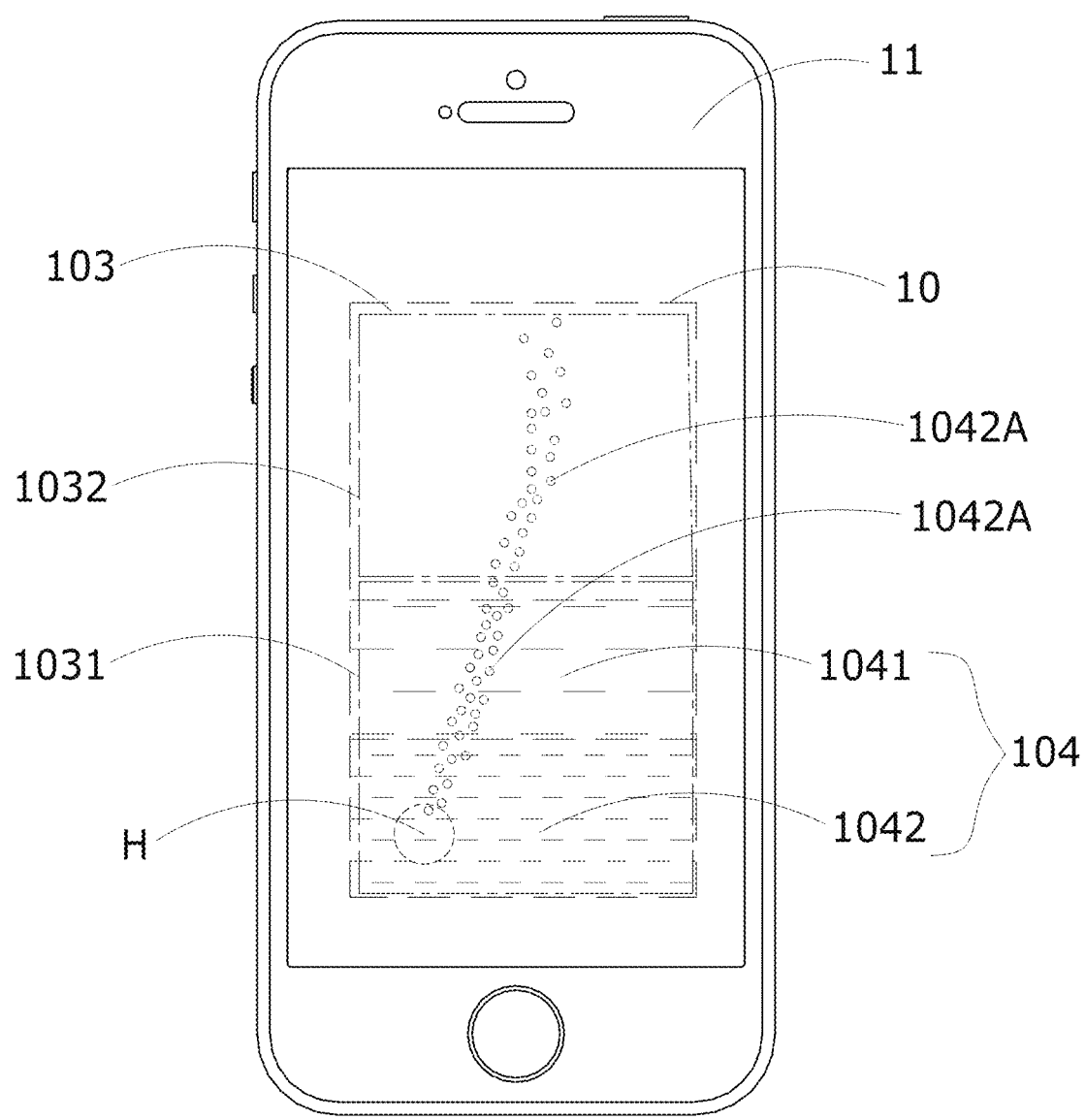
FIG. 3 is a schematic view I of the implementation of the present disclosure.
Figure 4:
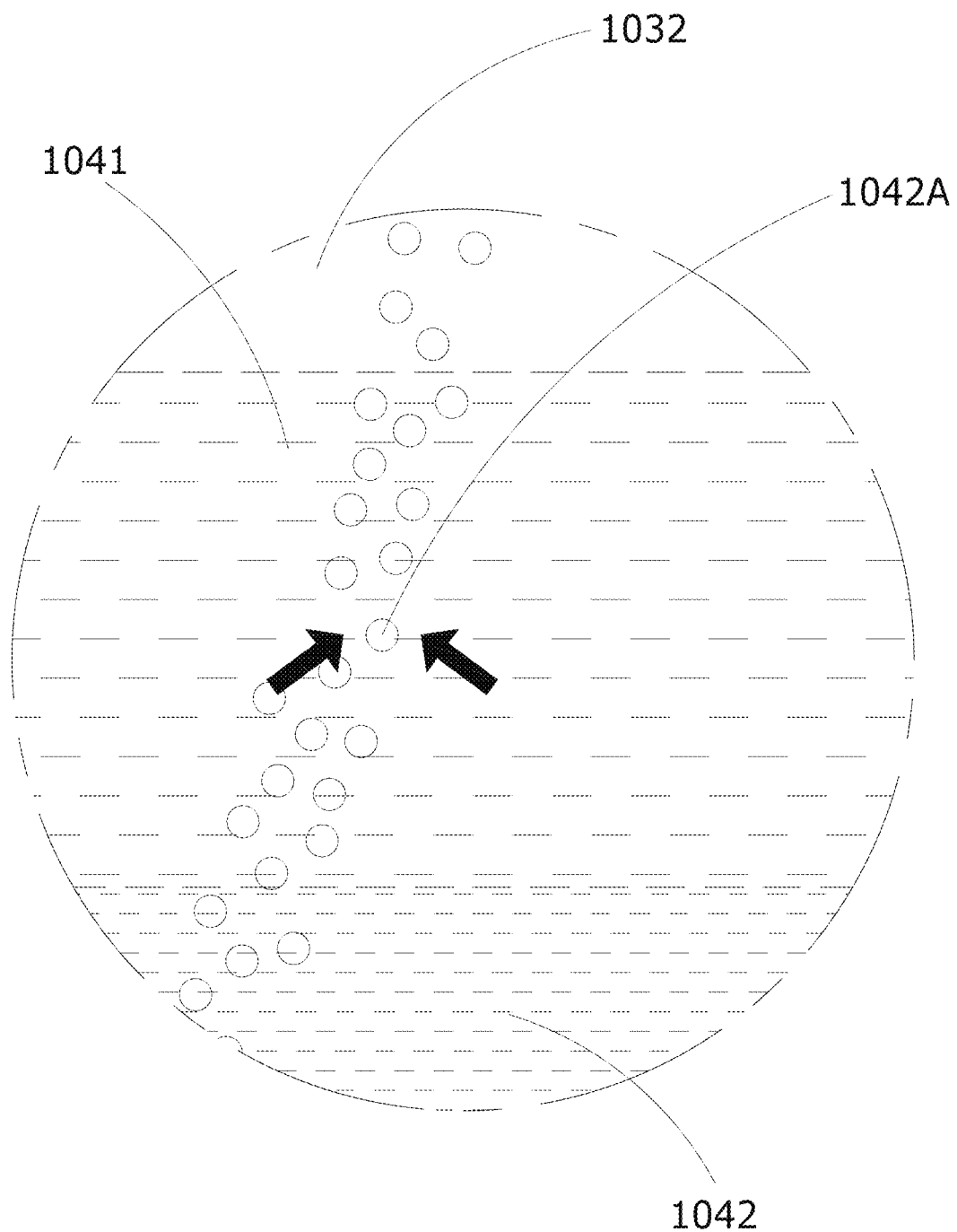
FIG. 4 is a schematic view II of the implementation of the present disclosure.
Figure 5:
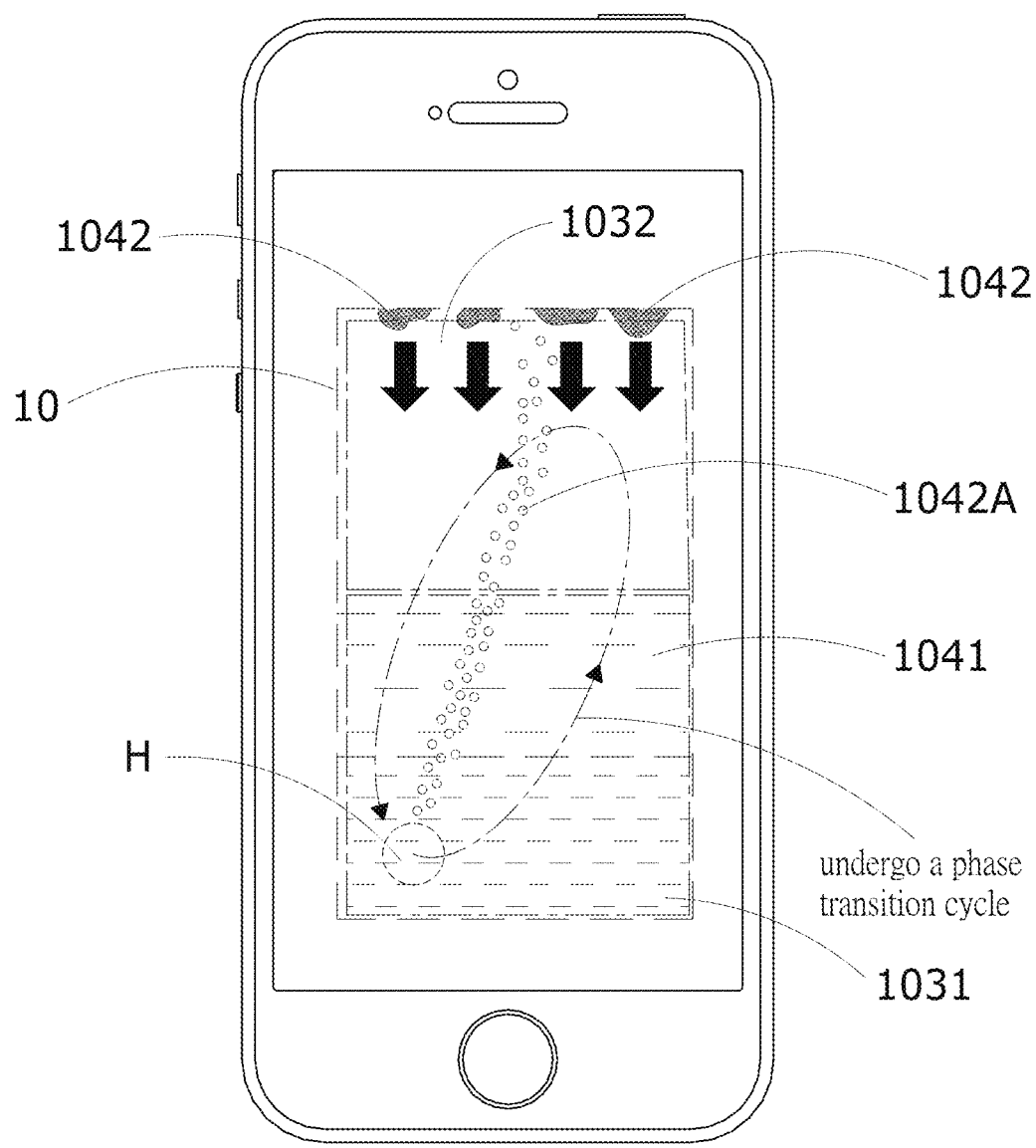
FIG. 5 is a schematic view III of the implementation of the present disclosure.

Referring to FIG. 3 together with FIG. 1, the dissipating device 10 is placed close to the heat source H of an electronic device 11, so that the thermal conductive fluid 104 in the dissipating device 10 is close to the heat source H. When the heat source H is created due to the operation of the electronic device 11, the first sheet body 101 and the second sheet body 102 of the dissipating device 10 conduct the heat energy of the heat source H. As the temperature of the heat source H gradually increases, the heat source H will heat the thermal conductive fluid 104 in the accommodating space 103 such that the thermal conductive fluid 104 undergoes a phase transition. As shown in FIG. 3, the heat source H is aligned to the second fluid medium 1042 of the thermal conductive fluid 104. The accommodating space 103 is divided into a first temperature change region 1031 and a second temperature change region 1032 due to the change of thermal conduction. In a normal state, the first temperature change region 1031 is adjacent to the heat source H. Therefore, the temperature of the first temperature change region 1031 is higher than that of the second temperature change region 1032. After the first temperature change region 1031 contacts the heat source H, the second fluid medium 1042 of the thermal conductive fluid 104 can absorb the heat energy of the heat source H and undergo a phase transition through thermal conduction such that the second fluid medium 1042 in the liquid state is transformed to the second fluid medium 1042A in the gas state. Referring again to FIG. 4. According to the principle of natural convection, the second fluid 1042A that becomes gaseous will be quickly pushed upwards by the first fluid 1041 so that the gaseous second fluid medium 1042A can be rapidly transferred into the second temperature change region 1032. As shown in FIG. 5, the temperature of the second temperature change region 1032 is relatively lower than that of the first temperature change region 1031. As a result, after the second fluid medium 1042A rises to the second temperature change region 1032, a phase transition will take place due to the temperature change. The gaseous second fluid 1042A will be condensed into the second fluid medium 1042 in the liquid state again at the top of the dissipating device 10. In this way, the second fluid medium 1042 condensed into the liquid state will fall back to the first fluid medium 1041. Since the density and specific gravity of the second fluid medium 1042 of liquid state are greater than that of the first fluid medium 1041, the second fluid medium 1042 of liquid state will pass through the layer of the first fluid medium 1041 and merge into the layer of the second fluid medium 1042. Meanwhile, the heat generated by the heat source H will be absorbed again, thereby reciprocating the above-mentioned circulation for heat dissipation. The circulation path of the phase transition is shown in the drawing. It is obvious from the above description that when the second fluid medium 1042 undergoes the phase transition, the gaseous second fluid medium 1042A will further rise to the top of the accommodating space 103. The volume loss of the second fluid medium 1042 after the vaporization flow will force the first fluid medium 1041 to flow down to fill the area lost by the vaporization and dissipation of the second fluid medium 1042. However, at the time, when the second fluid medium 1042 is condensed into the liquid state and flows downward through the layer of the first fluid medium 1041 to return to the layer of the second fluid 1042, the layer of the second fluid 1042 has already been occupied by the first fluid medium 1041. Since the specific gravity of the second fluid medium 1042 is greater than that of the first fluid medium 1041, the first fluid medium 1041 can be forced to flow upward, when the second fluid medium 1042 is returned back to its starting position. Accordingly, the first fluid medium 1041 is not affected by gravity creating a downward flowing force. Referring again to FIG. 1, during the circulation of the thermal conductive fluid 104, the thermal conductive fluid 104 continuously transfers heat energy to the first sheet body 101 and the second sheet body 102 of the dissipating device 10, thereby rapidly reducing the temperature of the heat source H. The dissipating device 10 of the present disclosure can be customized according to different types of electronic devices and formed into a thin structure, thereby providing a better heat dissipating effect.

Figure 6:
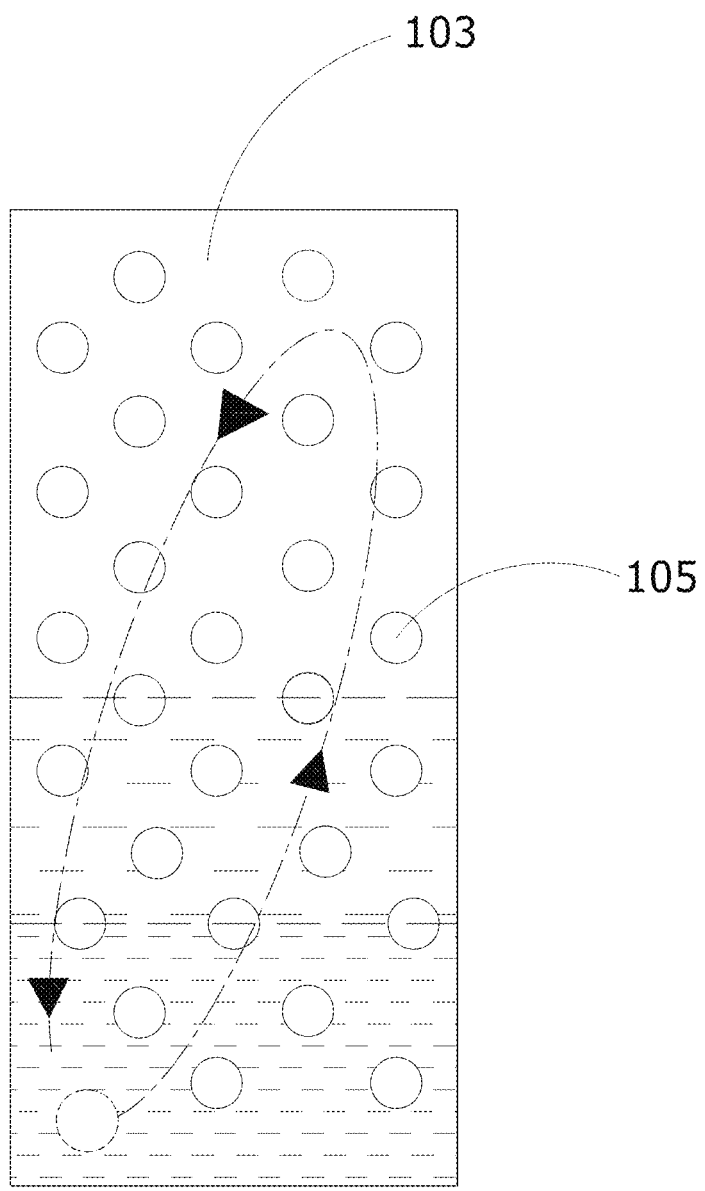
FIG. 6 is a schematic view of a second embodiment of the present disclosure.
Figure 7:
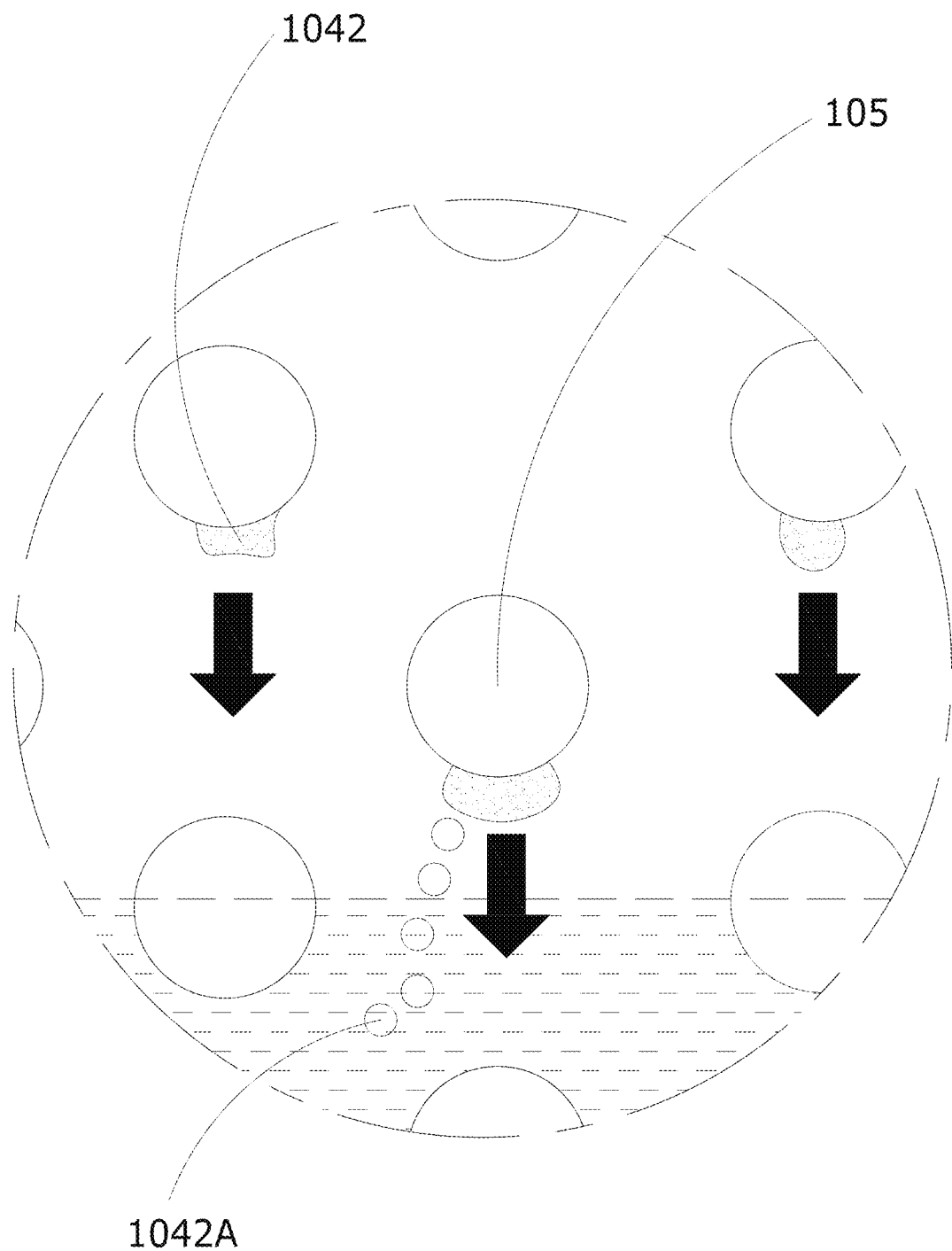
FIG. 7 is a schematic view of the implementation of the second embodiment of the present disclosure.
Figure 8:
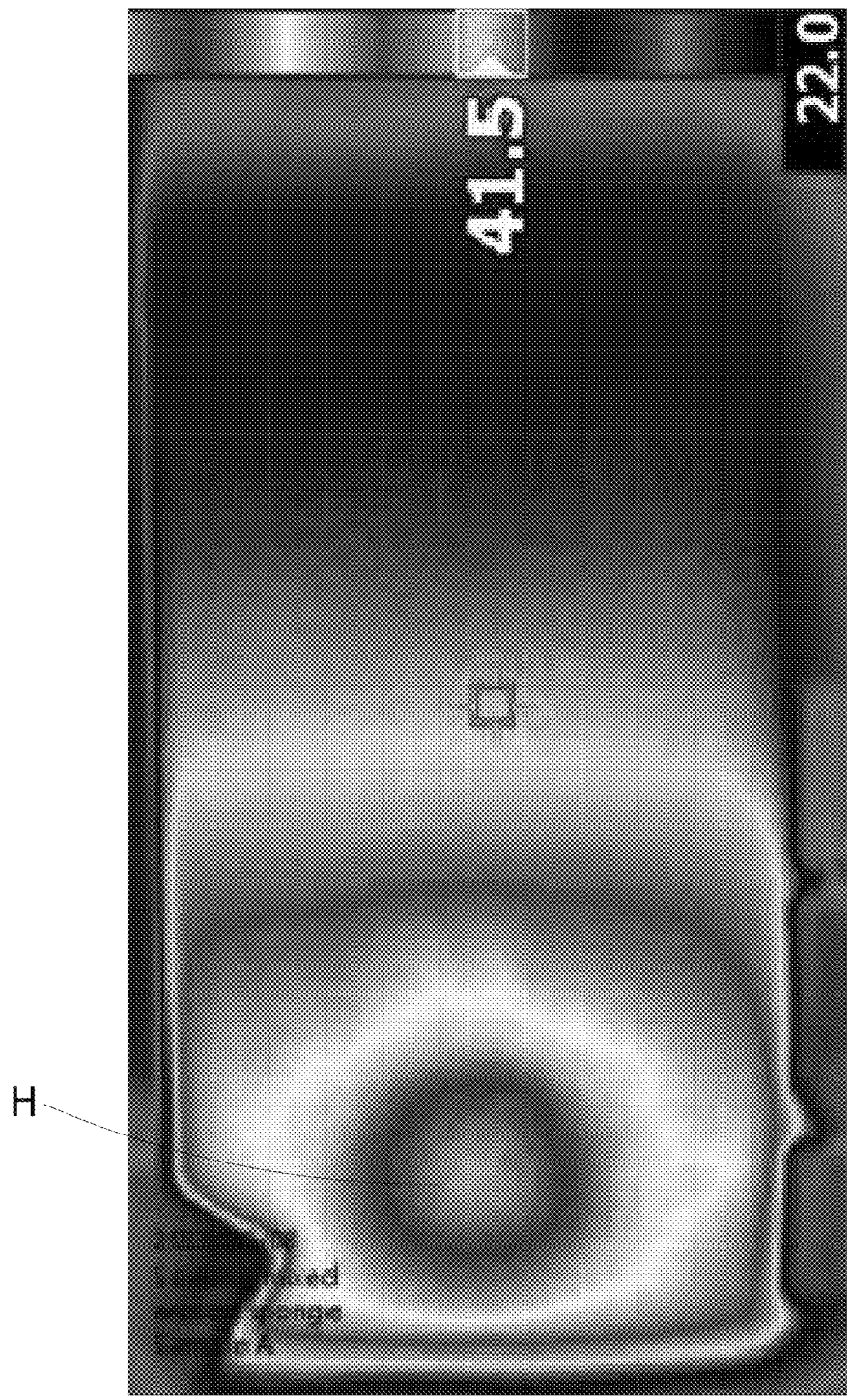
FIG. 8 is a thermographic image of the second embodiment of the present disclosure.

Referring to FIG. 6 together with FIG. 1, a plurality of projections 105 are formed in the accommodating space 103. The projections 105 can be provided on the inner surface of the first sheet body 101 or the second sheet body 102 by dispensing in advance. Referring again to FIG. 7, when the second fluid medium 1042 of liquid state is heated to be transformed into the gaseous second fluid medium 1042A to rise, the second fluid medium 1042A will gradually be condensed and attached to each projections 105 to form gradually a liquid and fall. The distribution of the projections 105 can effectively increase the circulation efficiency of the phase transition of the thermal conductive fluid 104. The thermographic image of the heat source according to the first embodiment of the present disclosure is shown in FIG. 8. It is obvious from FIG. 8 that through the distribution of the projections 105, the circulation efficiency of the phase transition of the thermal conductive fluid 104 can be effectively accelerated, thereby achieving an effective and quick heat dissipation for the electronic device.

Figure 9:
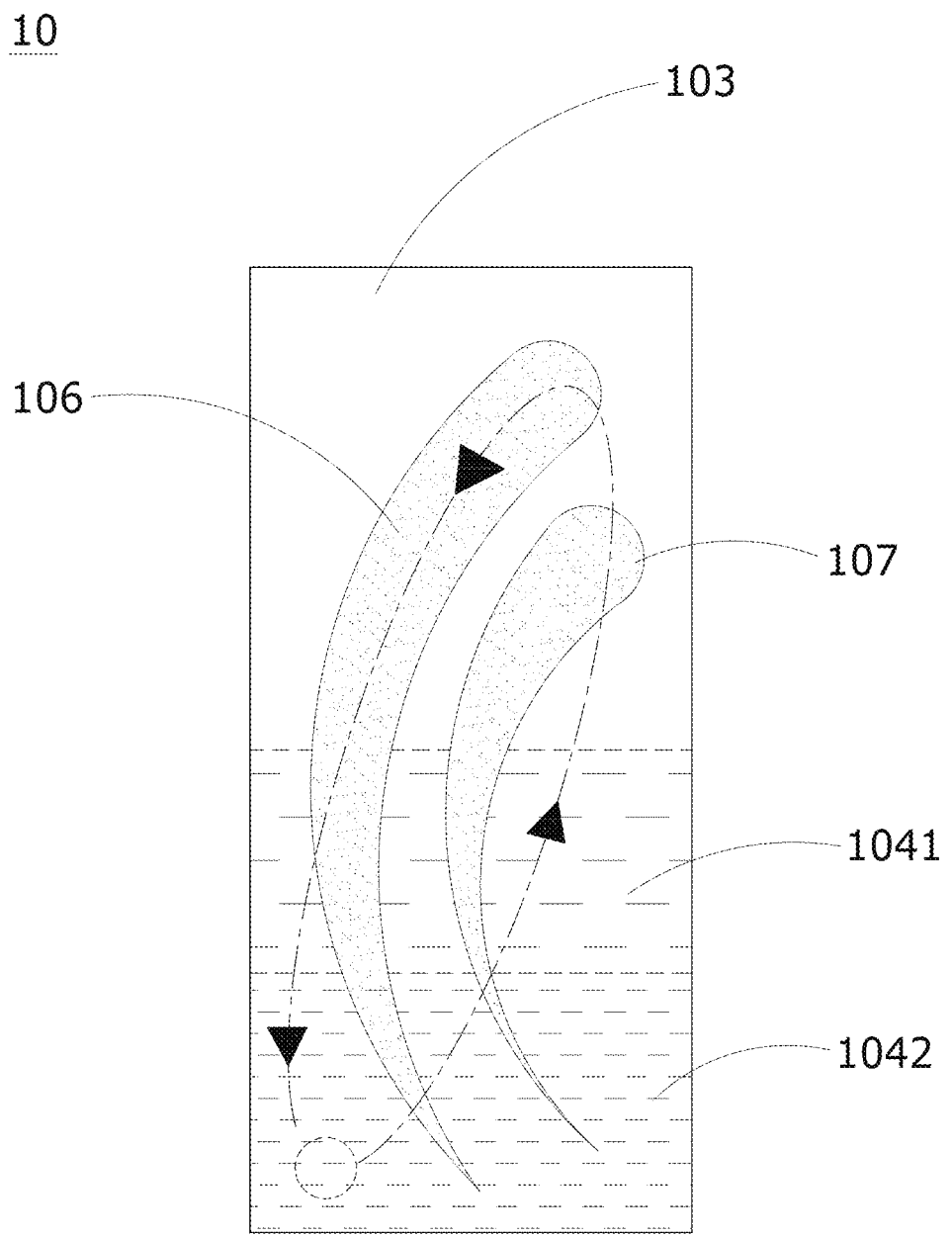
FIG. 9 is a schematic view of a third embodiment of the present disclosure.
Figure 10:
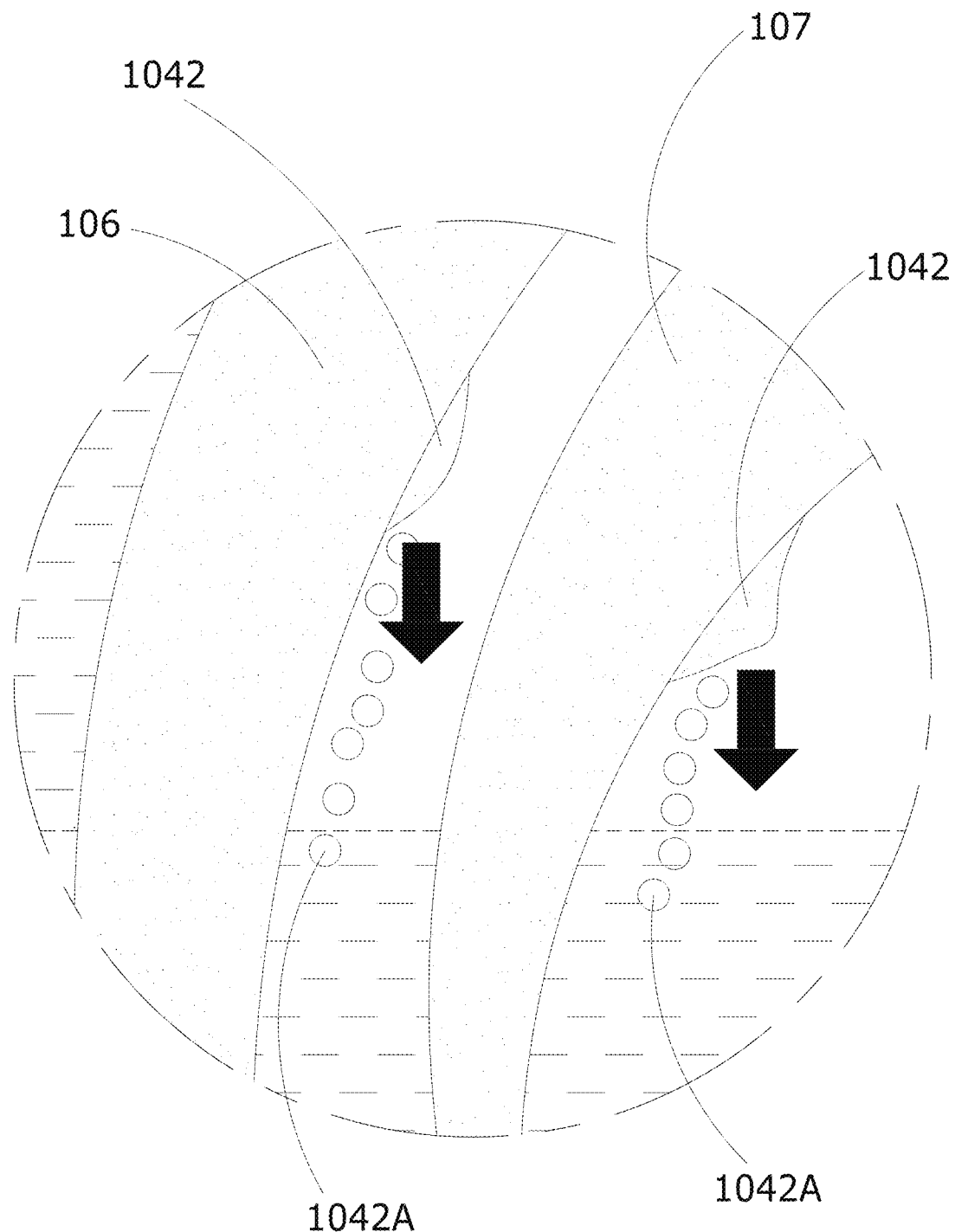
FIG. 10 is a schematic view of the implementation of the third embodiment of the present disclosure.
Figure 11:
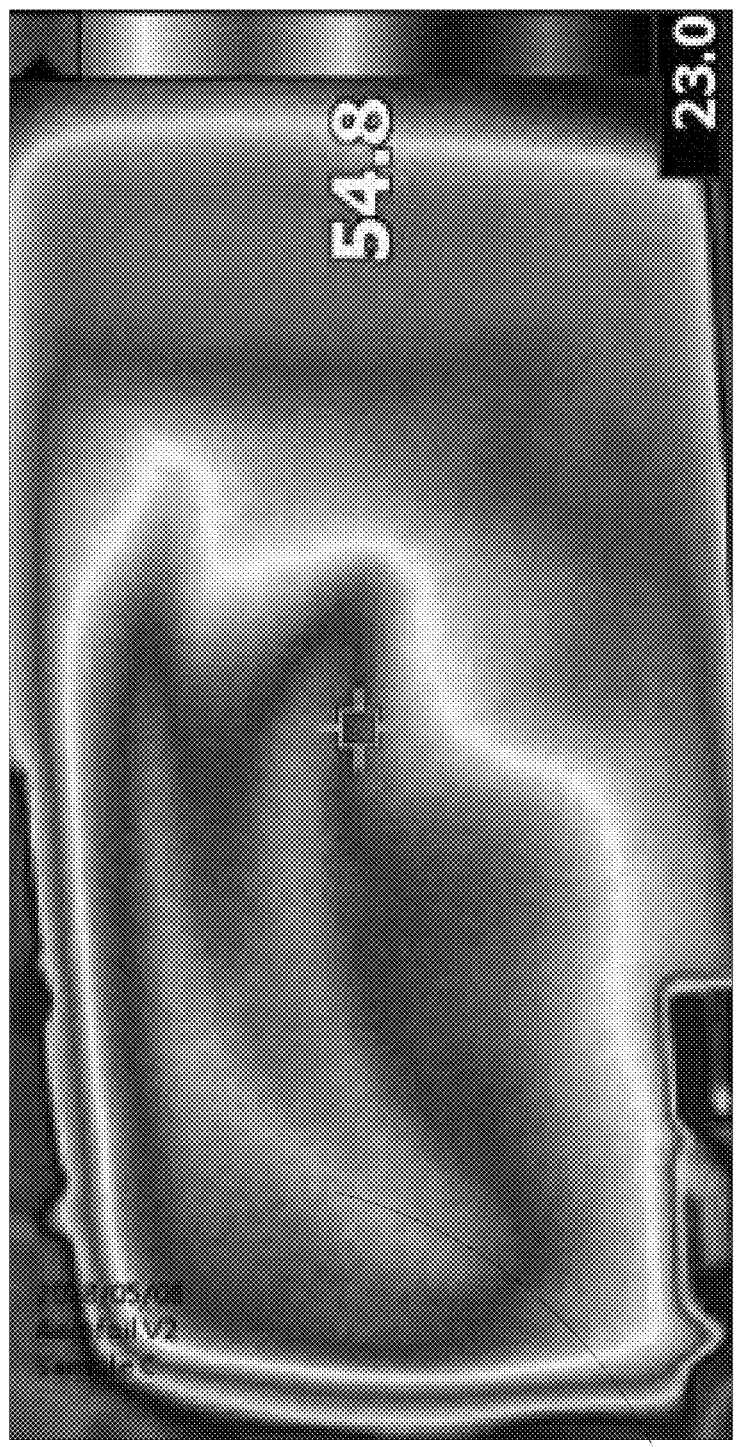
FIG. 11 is a thermographic image of the third embodiment of the present disclosure.

Referring to FIG. 9, a first retaining wall 106 and a second retaining wall 107 are positioned in the accommodating space 103 of the dissipating device 10. Both of the retaining walls 106, 107 can be created by, for example, pre-forming the outer contour of the two retaining walls (106, 107) with colloid. Thereafter, the first fluid medium 1041 and the second fluid medium 1042 are filled into the room of the accommodating space 103 outside the two retaining walls 106, 107. Referring to FIG. 10, when the second fluid medium 1042 of liquid state is transformed to the gaseous second fluid medium 1042A and rises, it will be gradually condensed and attached to the inner wall surfaces of the first retaining wall 106 and the second retaining wall 107 and then gradually forms a liquid to fall. The arrangement of the two retaining walls 106, 107 can effectively increase the circulation efficiency of the phase transition of the thermal conductive fluid 104. The thermographic image of the heat source according to the second embodiment of the present disclosure is shown in FIG. 11. It is obvious from FIG. 11 that through the arrangement of the two retaining walls 106, 107, the circulation efficiency of the phase transition of the thermal conductive fluid 104 can be effectively accelerated, thereby achieving an effective and quick heat dissipation for the electronic device.

Figure 12:
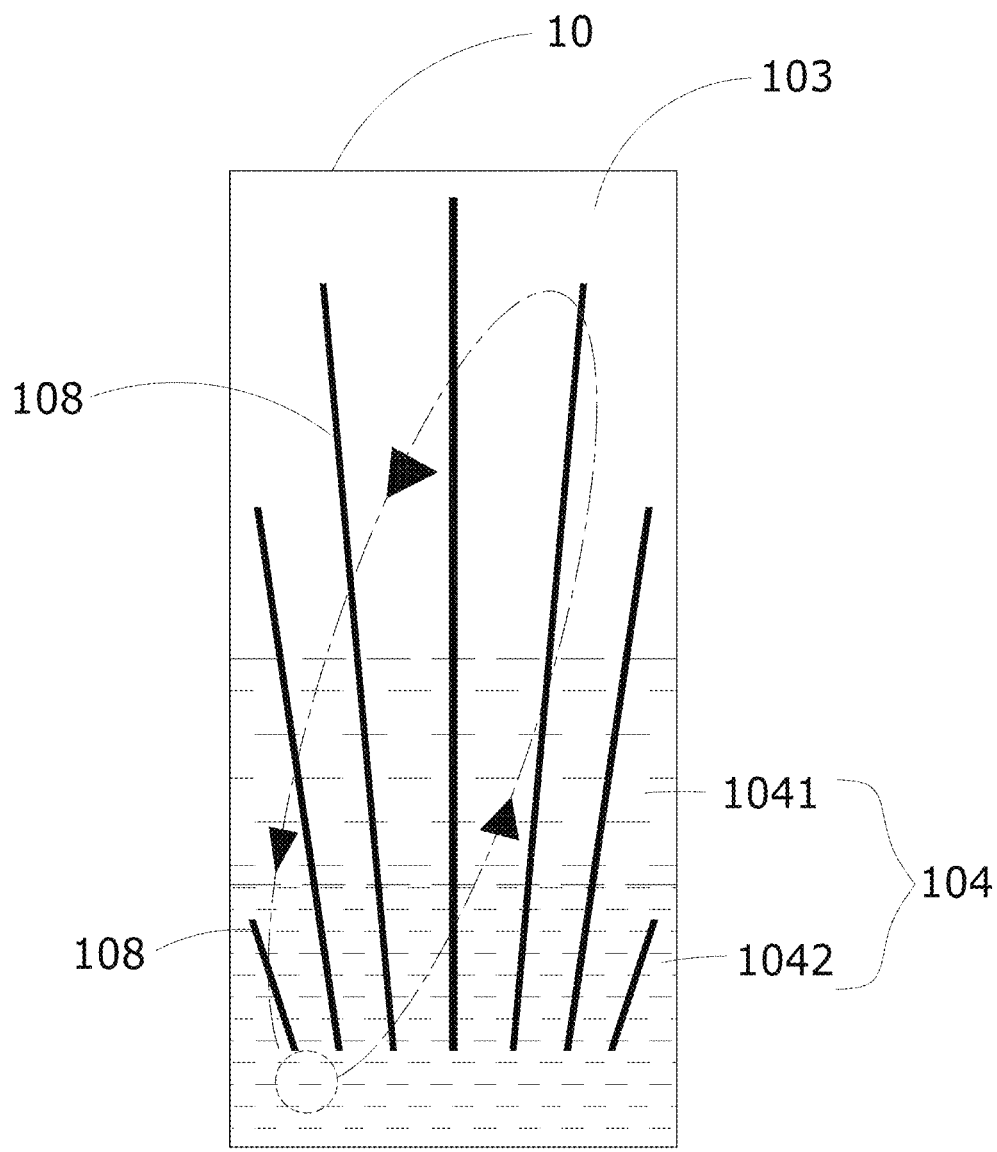
FIG. 12 is a schematic view of a fourth embodiment of the present disclosure.
Figure 13:
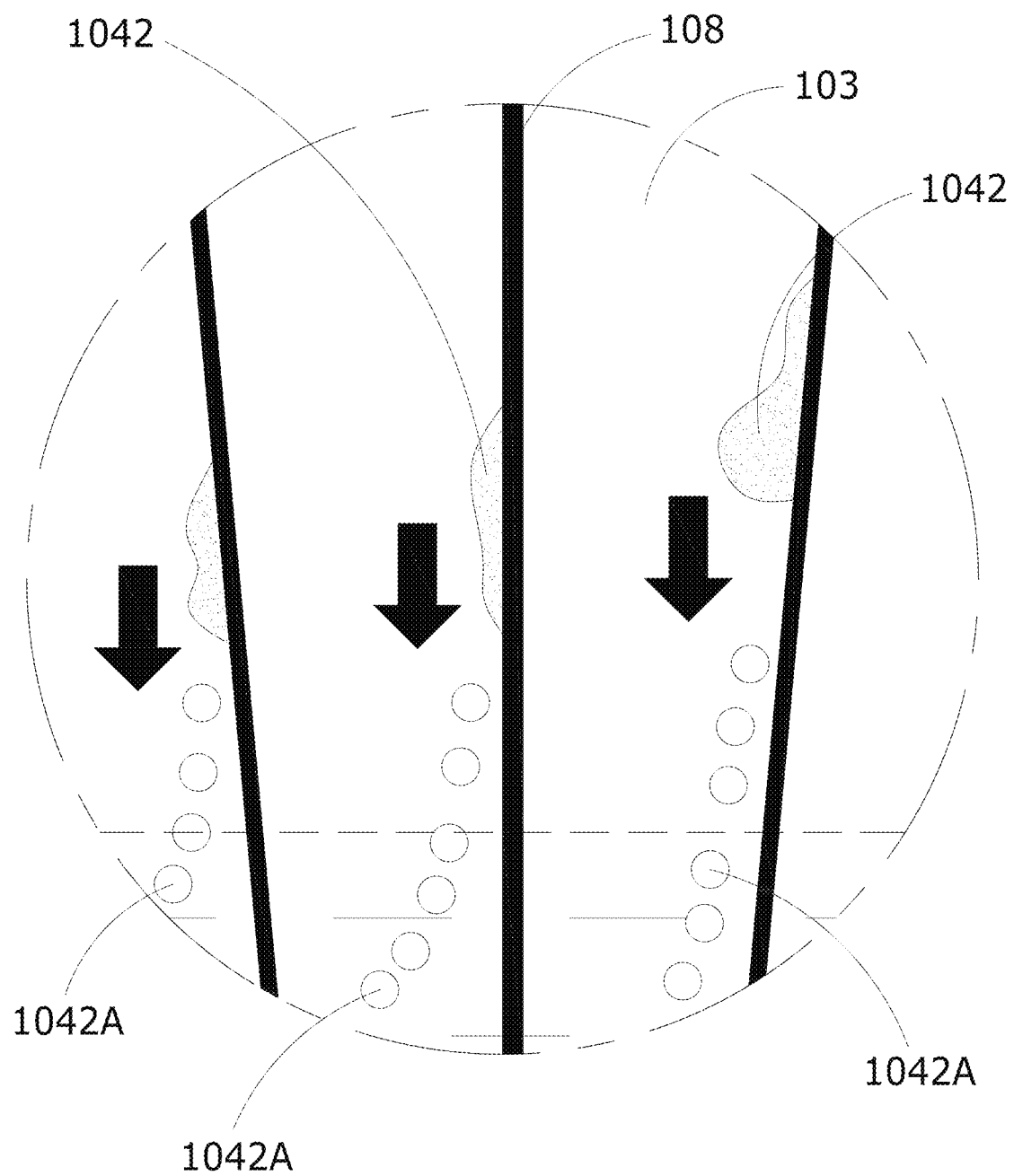
FIG. 13 is a schematic view of the implementation of the fourth embodiment of the present disclosure.
Figure 14:
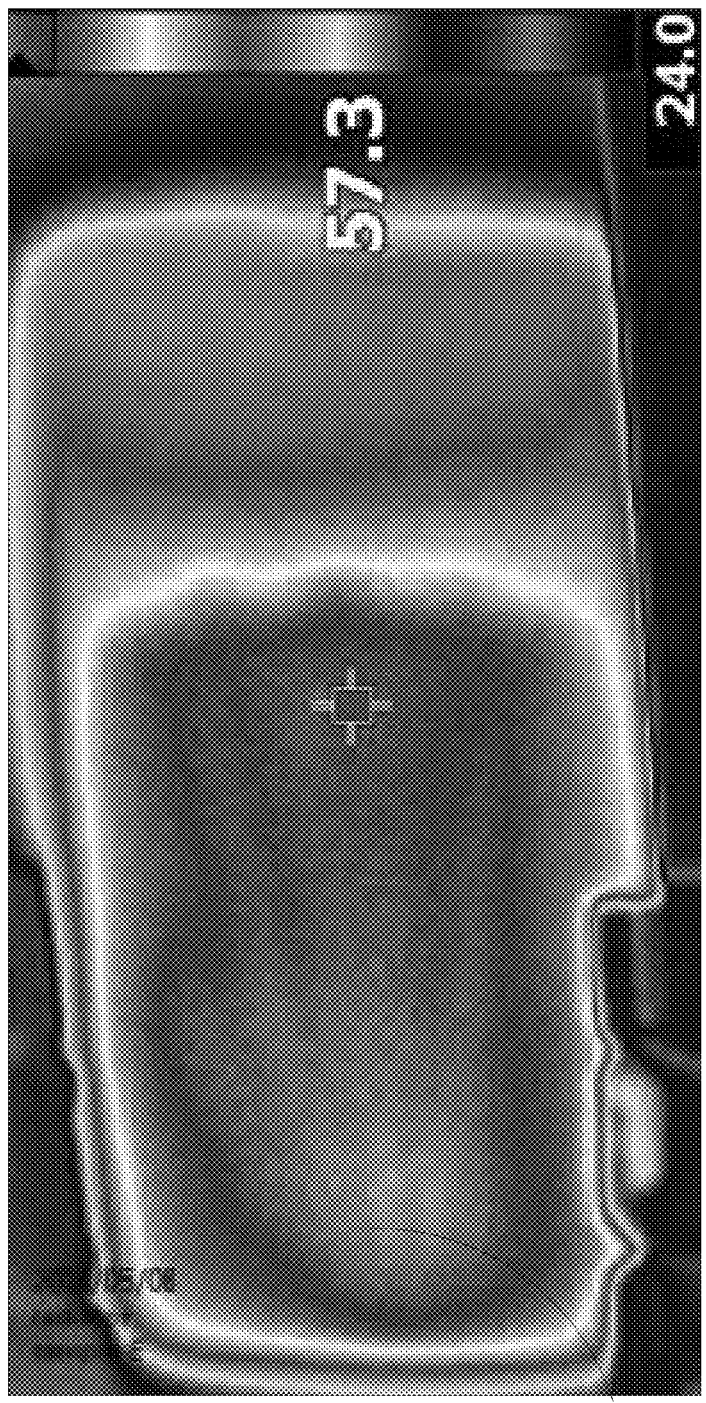
FIG. 14 is a thermographic image of the fourth embodiment of the present disclosure.

Referring to FIG. 12, a plurality of protruding ribs 108 arranged radially are formed in the accommodating space 103 of the dissipating device 10. The protruding ribs 108 can be created by, for example, pre-forming with colloid. Thereafter, the thermal conductive fluid 104 is filled into the accommodating space 103. Referring to FIG. 13, when the thermal conductive fluid 104 undergoes the circulation of phase transition, the second fluid medium 1042 of liquid state is transformed to the gaseous second fluid medium 1042A and rises. In this way, it will be gradually condensed and attached to the external surfaces of the protruding ribs 108 and then gradually forms a liquid to fall. The arrangement of the two protruding ribs 108 can effectively increase the circulation efficiency of the phase transition of the thermal conductive fluid 104. The thermographic image of the heat source according to the third embodiment of the present disclosure is shown in FIG. 14. It is obvious from FIG. 14 that through the arrangement of the protruding ribs 108, 107, the circulation efficiency of the phase transition of the thermal conductive fluid 104 can be effectively accelerated, thereby achieving an effective and quick heat dissipation for the electronic device.

Figure 15:
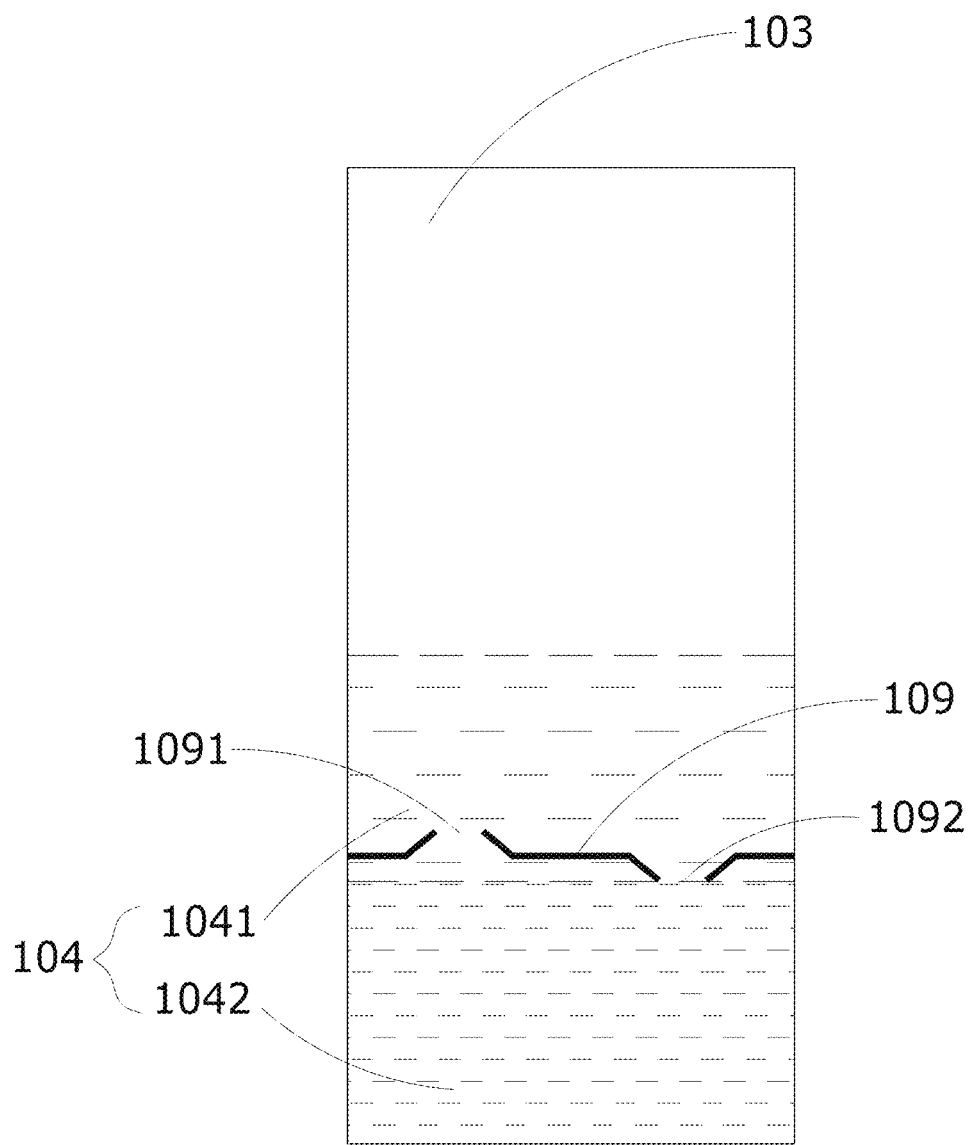
FIG. 15 is a schematic view of a fifth embodiment of the present disclosure.
Figure 16:
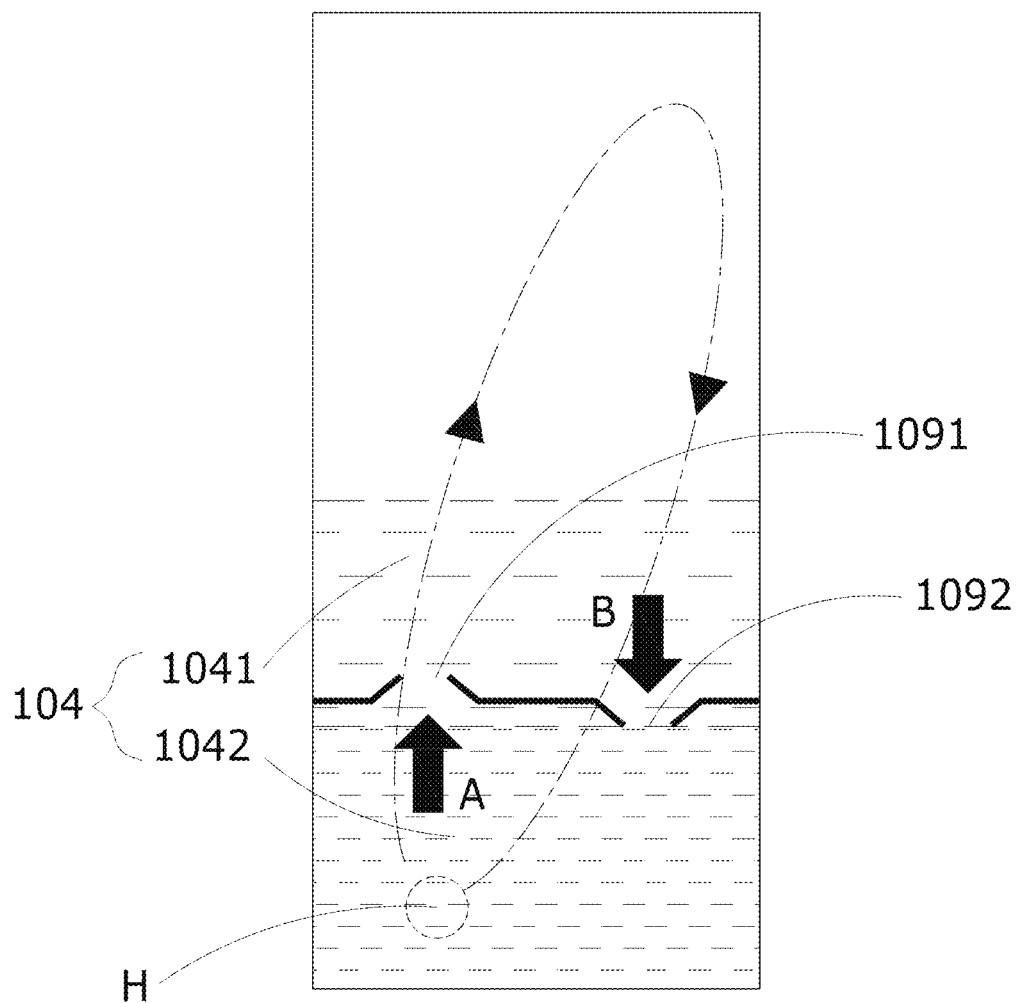
FIG. 16 is a schematic view of the implementation of the fifth embodiment of the present disclosure.

Referring to FIG. 15, a diverting portion 109 is disposed in the accommodating space 103 of the dissipating device 10. The diverting portion 109 may be in the form of a retaining wall. The diverting portion 109 is provided with a first outlet 1091 and a second outlet 1092. As shown in the drawing, the first outlet 1091 is tapered from bottom to top, while the second outlet 1092 is tapered from top to bottom. The accommodating space 103 is filled with the thermal conductive fluid 104. With reference to FIG. 16, the second fluid medium 1042 of the thermal conductive fluid 104 absorbs the heat energy of the heat source H, and then undergoes the phase transition to cause the second fluid medium 1042 to vaporize. The vaporized second fluid medium 1042 will only pass through the first outlet 1091 (as indicated by arrow A), because the two outlets 1091, 1092 are tapered upward and downward, respectively, thereby forming a flow resistance. In order to fill the dissipated second fluid medium 1042, the first fluid medium 1041 will only flow into the second outlet 1092 (as indicated by arrow B). The arrangement of the flow guide 109 allows the thermal conductive fluid 104 to re-absorb the heat source H to create the thermal circulation path.

In summary, the dissipating device of the present disclosure is mainly composed of the first sheet body 101 and the second sheet body 102. An accommodating space 103 is created after the first sheet body 101 and the second sheet body 102 are joined together. The accommodating space 103 is filled with a thermal conductive fluid 104 which is a mixture of two immiscible fluid mediums. When the dissipating device is close to the heat source of the electronic device, the thermal conductive fluid will gradually undergo the phase transition, thereby achieving a continuous circulation and flow of the thermal conductive fluid. Accordingly, the electronic device can be cooled down by means of the phase transition of the thermal conductive fluid. In other word, the electronic device can be cooled down by phase transition of the thermal conductive fluid 104 mixed by two immiscible fluid mediums.

All the above is showed with only preferred embodiments but not to limit the scope of implementation of the present disclosure. Any changes or modifications, which made by those who skilled in this art without departing from the spirit and the scope of the present invention, should be covered in the scope of the patent of the present disclosure.

What is claimed is:

1. A dissipating device positioned on a heat source of an electronic device, comprising:
   a first sheet body;
   a second sheet body joined to a peripheral edge of the first sheet body, an accommodating space being formed between the first sheet body and the second sheet body after the first sheet body and the second sheet body are joined together; and
   a thermal conductive fluid filled in the accommodating space, the thermal conductive fluid being formed by mixing a first fluid medium and a second fluid medium both of which are two immiscible liquids,
   wherein the thermal conductive fluid absorbs heat from the heat source to undergo a phase transition,
   wherein the first fluid medium and the second fluid medium are able to flow and push against each other by means of the phase transition for dissipating the heat generated by the heat source through thermal conduction;
   wherein a diverting portion is formed in the accommodating space,
   wherein the diverting portion is provided with a first outlet and a second outlet, and
   wherein both of the outlets are configured to create a thermal circulation path after the phase transition of the thermal conductive fluid takes place.

2. The dissipating device as recited in claim 1, wherein peripheral edges of the first sheet body and the second sheet body are joined by ultrasonic welding or adhesion.

3. The dissipating device as recited in claim 1, wherein the specific gravity or density of the second fluid medium is greater than that of the first fluid medium.

4. The dissipating device as recited in claim 1, wherein the first fluid medium is formed by mixing alcohols and water.

5. The dissipating device as recited in claim 4, wherein the second fluid medium is fluoride.

6. The dissipating device as recited in claim 1, wherein a volume ratio of the thermal conductive fluid to the accommodating space ranges from 0.5 to 0.95.

7. The dissipating device as recited in claim 1, wherein a plurality of projections are formed in the accommodating space.

8. The dissipating device as recited in claim 1, wherein a first retaining wall and a second retaining wall are formed in the accommodating space.

9. The dissipating device as recited in claim 1, wherein a plurality of protruding ribs arranged radially are formed in the accommodating space.

10. The dissipating device as recited in claim 1, wherein the first outlet is tapered from bottom to top, while the second outlet is tapered from top to bottom.

* * * * *